United States Patent [19]

Basile et al.

[11] Patent Number: 4,842,961
[45] Date of Patent: Jun. 27, 1989

[54] ALTERNATE ELECTROLYTIC/ELECTROLESS-LAYERED LID FOR ELECTRONICS PACKAGE

[75] Inventors: Thomas J. Basile, New Hartford; Jean LaPlante, Oriskany, both of N.Y.

[73] Assignee: Advanced Materials Technology Corp., Oriskany, N.Y.

[21] Appl. No.: 164,395

[22] Filed: Mar. 4, 1988

[51] Int. Cl.$^4$ .............................................. B32B 15/18
[52] U.S. Cl. .................... 428/672; 174/52.4;
204/40; 204/46.1; 204/47.5; 427/125; 427/305;
427/405; 427/438; 428/679; 428/680; 428/935;
428/936; 437/221
[58] Field of Search ............... 428/672, 679, 680, 935,
428/936; 204/40, 47.5, 49, 46.1; 174/52 FP;
357/74; 437/221; 427/125, 405, 438, 305

[56] References Cited

U.S. PATENT DOCUMENTS

| | | | |
|---|---|---|---|
| 2,594,933 | 4/1952 | Knapp et al. | 204/49 |
| 2,643,221 | 6/1953 | Brenner et al. | 204/44 |
| 3,304,362 | 2/1967 | August | 428/620 |
| 3,946,190 | 3/1976 | Hascoe | 219/86.9 |
| 4,305,997 | 12/1981 | Feldstein | 428/652 |
| 4,320,169 | 3/1982 | Yatabe et al. | 428/333 |
| 4,356,047 | 10/1982 | Gordon et al. | 156/89 |
| 4,411,965 | 10/1983 | Rosegren et al. | 428/672 |
| 4,503,131 | 3/1985 | Baudrand | 428/672 |
| 4,601,958 | 7/1986 | Levine | 428/672 |
| 4,620,661 | 11/1986 | Slatterly | 228/209 |
| 4,626,479 | 12/1986 | Hosoi et al. | 428/663 |
| 4,640,438 | 2/1987 | Trevison et al. | 220/359 |
| 4,649,229 | 3/1987 | Scherer et al. | 174/52 FP |
| 4,666,796 | 5/1987 | Levine | 428/670 |
| 4,737,418 | 4/1988 | Slattery | 428/679 |

OTHER PUBLICATIONS

"ELNIC 100", ELNIC Inc., Nashville, TN, Jan. 1986.
"Corrosion Resistance of Electroless Nickel Coatings", ELNIC Inc., Nashville, TN, Aug. 1981, pp. C41–C54.
"The Engineering Properties of Electroless Nickel Coatings", ELNIC Inc., Nashville, TN, Dec. 1980, pp. C3–C27.
G. G. Gawrilov, *Chemical(Electroless) Nickel-Plating*, 1979, pp. 81–88.

*Primary Examiner*—Robert McDowell
*Attorney, Agent, or Firm*—Wall and Roehrig

[57] ABSTRACT

A lid or cover for a ceramic enclosure is formed of a substrate of an iron-based alloy, e.g., Kovar, alternately plated and coated with electrolytic nickel and electroless nickel, with an outer gold electroplate. The alternate electroplate and electroless nickel layers render the lid highly corrosion resistant without the need for an expensive, unrecoverable buried gold layer.

15 Claims, 1 Drawing Sheet

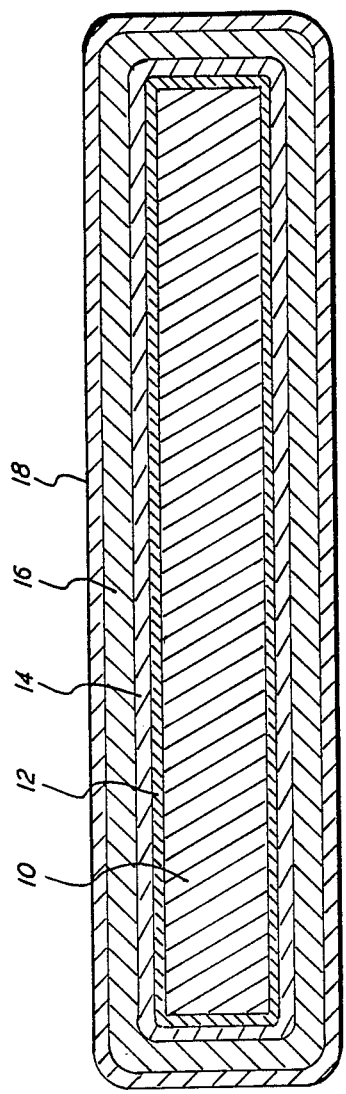

ALTERNATE ELECTROLYTIC/ELECTROLESS-LAYERED LID FOR ELECTRONICS PACKAGE

BACKGROUND OF THE INVENTION

This invention relates to a corrosion resistant lid used to close a semiconductor package and, in particular, to a lid having a novel protective coating composition.

In many semiconductor applications, the semiconductor device is required to be hermetically sealed within a "package" i.e., a ceramic case or housing that protects the device from the surrounding ambient and thus enhances its reliability. As explained in further detail in U.S.Pat. Nos. 3,340,602; 3,538,597; 3,874,549 and 3,946,190, the package typically includes a container having a cavity in which the device is securely mounted. Electrical leads are passed out of the container and are connected to appropriate circuitry. The package is sealed closed using a lid which is placed in registry over the cavity. The lid is hermetically sealed in place using a eutectic solder frame formed of an alloy made up e.g. of 80% gold and 20% tin.

The lid that is used throughout the industry is typically made from a Kovar stamping. Kovar is a well known alloy containing various amounts of cobalt, nickel and iron. Lids have heretofore been provided with a top coating of gold that is placed over an inner or barrier layer of nickel. This coating provides an excellent bonding surface for the solder frame and also provides a corrosion resistant shield for the Kovar substrate which, because it contains iron, is highly susceptible to rust damage. The nickel interface usually consists of between 50 and 150 microinches of low stress nickel while the top coat consists of about 50 microinches of a noble metal, i.e., pure gold. Although this dual combination exhibits good solder ability, the lid nevertheless will often rust when exposed to a corrosive atmosphere for an extended period of time. Corrosion in amounts of between 2-4% of the total surface area of the lid will generally occur within 24 to 96 hours when the coated lid is exposed to a salt-containing atmosphere.

The accepted industry standard which governs the amount of corrosion allowable for high reliability packages are set out in the military specification Mil. Std. 883 C. This specification has been recently revised so that all lids now must remain corrosion free (zero corrosion) after being exposed to a salt-containing atmosphere for at least 24 hours. Dual coated lids found in the prior art, i.e., those having a single lower coating of nickel and a top coating of gold, continually fail this corrosion test.

All electroplated metal coatings exhibit porosity to some extent and thus permit rust producing agents to pass therethrough to the base metal. Methods have been tried with varying degrees of success to reduce the porosity of protective coatings and to increase the resistance of these lids to corrosion. Porosity is usually inversely proportional to the thickness of an electroplated metal and the pores that initially form in the coating material close gradually as more metal is deposited. As the coating thickens, the pores eventually close. Approximately 2000 microinches of nickel and about 100 microinches of gold are required, however, to completely close the pores on a dual coated lid. The consumption of this amount of metal is not only expensive, but also requires an extraordinary amount of time to complete the plating process.

Pulse plating has also been tried with some limited success in an effort to close the pores in the coating materials. In this process, the current applied to the electroplating tank is pulsed on and off periodically by a square wave generator. The pulsing provides for increased ion mobility in the bath which, in turn, results in a smaller more densely packed crystal structure in the electroplated metals. This denser deposit is believed to fill the pores more rapidly and thus provide greater protection for a given coating thickness. Although the amount of corrosion may be reduced by this technique, pulse coating alone cannot provide economically feasible products capable of meeting the new standard within the industry.

More recent approaches to solving the porosity problem are set forth in U.S. Pat. No. 4,601,958, granted July 22, 1986 and U.S. Pat. No. 4,620,661, granted Nov. 4, 1986. Both of these patents disclose closures or lids for semiconductor packages that are coated with plural alternate electroplated layers of nickel and gold. Thus, the substrate of Kovar or the like is coated with a first layer of nickel, then a first layer of gold, then a second layer of nickel, followed by a second layer of gold. The resultant plated lids have been shown to have substantially higher resistance to salt atmosphere corrosion than lids having but a single layer of nickel and a single layer of gold.

Despite the improved results obtained by the multilayer approach, some problems remain. One of these is the difficulty in recovering gold in the first or intermediate gold layer of rejected, sub-standard plated lids because no effective stripping agent for nickel is presently available. Another problem is that the second or outer nickel electroplate layer can be stressed causing blistering and separation from the gold layers.

OBJECTS AND SUMMARY OF THE INVENTION

It is therefore an object of the present invention to improve electronics packages used to house semiconductor devices.

It is a further object of the present invention to improve lids used to hermetically seal semiconductor packages.

It is a further object of the present invention to improve the corrosion resistance properties of a closure lid for a semiconductor package without creating new problems that may result from other multi-layer plating approaches.

It is another object of the present invention to provide a coating for an electronics package closure lid that avoids alternate layering of different metals, but still achieves high resistance to corrosive penetration.

Still another object of the present invention is to provide a lid or cover for hermetically sealing an electronics package that fully conforms with the prevailing industry standards.

These and other objects of the present invention are attained by means of a lid for an electronics package that comprises an iron-based substrate, a first layer of nickel electroplated on the substrate, an electroless nickel layer, a second layer of nickel electroplated on the electroless nickel layer, and a layer of a noble metal plated on the second nickel electroplate layer. The utilization of an electroless nickel is particularly advantageous in that, unlike electroplated nickel, it is closergrained and lacks the electroplated nickel's inevitable microscopic porosity. The electroless nickel interlayer prevents penetration by corrosive salt atmosphere through the nickel pores to the substrate.

In the lid provided by the present invention, there is no intermediate or inner layer of gold and therefore gold recovery is not a problem in the event of a reject. By the same token, stress in the electroless nickel layer is not a problem, and because the electroless layer supports a nickel electroplate layer, the time for and the cost of electroplating is reduced.

The above and other objects, features, and advantages of the invention will be more fully apparent from the ensuing description of a preferred embodiment, considered in connection with the accompanying drawing.

BRIEF DESCRIPTION OF THE DRAWING

The sole drawing Figure shows in cross section the plated lid according to an embodiment of this invention.

DETAILED DESCRIPTION OF THE PREFERRED EMBODIMENT

With reference to the sole Figure, a stamping of Kovar strip or sheet, typically of ten mils (0.010 inch) thickness serves as a lid substrate 10, and after having been suitably cleaned and pretreated is plated with a first nickel electroplate layer 12 of a suitable thickness. An electroless nickel layer 14 is then deposited over the layer 12. This layer has a thickness in the range of about 20 to 80 microinches. An electrolytic nickel layer 16 is plated over the layer 14 to a thickness of about 50 to 150 microinches, and finally an outer gold layer 18 (or a layer of another noble metal, such as platinum) is plated thereon as the outer noncorrosible layer.

The following process is employed to create the above plated lid.

The Kovar substrate 10 is initially prepared with a ten minute soak in a cleaner bath heated to a temperature of 180 degrees F to 200 degrees F. The substrate 10 is given two counterflow rinses of two minutes each and then is placed in a solution of Electroclean or similar cleaner for ten minutes at 180 degrees F to 190 degrees F, followed by two counterflow rinses of about two minutes each. The substrate is then placed in an aqueous acid activation bath for fifteen minutes. The bath is preferably 10% HCl by weight, and 6% by weight of suitable commercial activator. This is again followed by two counterflow rinses, of two minutes each. The Kovar substrate is now ready for the plating and coating process.

First a nickel strike is carried out on the substrate. This is a high intensity, short duration plating treatment in which nickel ions are driven, e.g., by current pulses deep into surface cracks in the substrate 10. This is carried on for fifteen minutes, and is followed by two ten minute counterflow rinses.

Now the first electroplate nickel layer 12 is formed. This is carried out by plating the substrate 10 in an electrolytic nickel bath for thirty minutes at a current of one-half ampere for each square foot of surface of the substrate 10. Then the plated substrate 10, 12 is removed and rinsed for five minutes in a counterflow rinse.

The layer 14 of electroless or "autocatalytic" nickel is deposited atop the layer 12. The deposition continues until the layer has a suitable thickness, nominally fifty microinches, i.e., twenty microinches minimum to eighty microinches maximum. Then the nickel plated and deposited substrate 10, 12, 14 is removed and rinsed for five minutes in a counterflow rinse.

The layer 16 is then plated over the electroless layer 14. For this, an electrolytic plating cycle of one-half ampere per square foot is applied for the first hour, and one ampere per square foot for the balance, until the layer 16 has a desired thickness in the range of fifty to one-hundred-fifty microinches. The order of the alternate layers can be reversed, or the layers can be put down in either sequence. Then the alternate nickel plated-deposited-plated substrate 10, 12, 14, 16 is removed and counterflow rinsed for three minutes.

A gold-strike plating operation is carried out for twenty-five to thirty minutes at a plating current of one-half ampere per square foot. This drives gold atoms into grain boundaries in the plated nickel layer 16. Then the workpiece is given a gold-reclamation rinse, and is plated with the pure gold layer to a thickness of twenty five microinches. This operation is carried out at one-half ampere per square foot. The temperature of the gold electrolyte bath should be between 110 degrees F and 120 degrees F, the lower end of this range yielding better density and better distribution and control.

The gold layer 18 is readily solderable e.g., with a gold/tin eutectic solder frame, to the associated ceramic housing. The solder frame hermetically seals the electronics device within the housing. This technique is well known and need not be described in detail or depicted here.

The lid device of this invention with alternate plated and electroless deposited nickel layers 14, 16 is superior in corrosion resistance to the earlier-proposed arrangements, i.e. single electroplate nickel and gold layers, or alternate nickel-gold-nickel-gold layers. The grain structures of the electroplate layers 12, 16 and the electroless layer 14 are quite different from one another. Any salt solution (i.e., chlorine ions) seeking to work between nickel grain boundaries towards the corrosible substrate 10 would be cut short at the boundary between layers 16 and 14. However, because the nickel crystal structure is the same for both layers 14, 16 at their interface, adhesion is quite good, and there is little or no incidence of separation and blistering.

On the other hand, whereas the electrolytic nickel of layers 12 and 16 is low stress, the electroless nickel of layer 14 is quite robust, in addition to having a low porosity. As a result, the electroless layer 14 compensates somewhat for thermal stressing of the plated layer 16 such as may occur during soldering.

The inner plated layer 12 serves as a grounding for the electroless layer 14 and adequate equivalent means could be substituted therefor.

EXAMPLE

A batch of lids were formed from Kovar 0.010 inches thick and coated with the alternating plated-electroless-plated nickel and outer plated gold layers as described above. The multicoated lids were cleaned and placed in a precleaned exposure chamber on a special support bracket designed not to cause corrosion of the lids when supporting them. An aqueous solution having a salt (NaCl) concentration of 0.3 to 0.5 percent by weight was prepared. The pH was measured between 6.0 and 7.5 at 95 degrees F. The specimens were then exposed to a direct flow of salt fog created from the solution. This fog was sprayed through the chamber at a suitable rate so that between 10,000 and 50,000 milligrams of salt were deposited per square millimeter of exposed area over a twenty-four hour period.

After the twenty four hour period the lids were removed from the chamber and washed in de-ionized water for five minutes. Then the lids were visually examined under a magnification of ten times to twenty times for any visible signs of corrosion. The specimens were found to be free of all signs of corrosion, including discoloration, electrochemical degradation, or corrosion sites.

This test was repeated several times, all with the same results.

In another lid according to this invention, a Kovar substrate was first given an underplate of electroless nickel to a thickness of twenty to fifty microinches. Followed by surface reactivation, the workpiece was plated with electrolytic nickel to a thickness between fifty and two hundred fifty microinches. A gold strike was then carried out either by pulse plating for a seven to ten microinch thickness or by a standard procedure with rectifier current of one-half ampere per square foot to the same thickness of seven to ten microinches. The workpiece was then gold plated to customer specifications, i.e., twenty five to fifty microinches.

In yet another lid, the Kovar substrate was given an electroless nickel underplate of ten to thirty microinches, and, following surface reactivation, a nickel electroplate layer of thirty to fifty microinches. On top of this, a second layer of electroless nickel was deposited to a thickness of ten to thirty microinches and a second electrolytic nickel plate layer of thirty to fifty microinches. A gold strike and a gold plate were applied with the same procedure as above.

In both of these, by virtue of the alternate layering of electroless and electroyltic nickel, the lids showed excellent resistance to corrosion and very high durability.

While this invention has been described in detail with reference to a preferred embodiment, the invention is certainly not limited to that specific embodiment. Rather, many modifications and variations would present themselves to those skilled in the art without departing from the scope and spirit of the invention, as defined in the appended claims.

What is claimed is:

1. A closure device for hermetically sealing an electronics package, comprising
   a base layer of iron-based alloy,
   a first layer of an electroplated nickel,
   a second layer of an electroless nickel,
   a third layer of an electroplated nickel having a thickness of at least 50 microinches, and
   a fourth layer of a plated noble metal.

2. A closure device as in claim 1 wherein said electroless nickel layer has a thickness in the range of about 20 to 80 microinches.

3. A closure device as in claim 1 wherein said third layer of electroplated nickel has a thickness of substantially 50 to 150 microinches.

4. A closure device for hermetically sealing an electronics package, consisting essentially of
   a base layer of iron-based alloy,
   a first layer of an electroplated nickel,
   a second layer of an electroless nickel,
   a third layer of an electroplated nickel having a thickness of at least 50 microinches, and
   a fourth layer of a plated noble metal.

5. A closure device as in claim 4 wherein said electroless nickel layer has a thickness in the range of about 20 to 80 microinches.

6. A process of producing a closure device for hermetically sealing an electronics package from a substrate formed of a base metal alloy, comprising the steps of
   plating said substrate with a first nickel electroplate layer,
   depositing a layer of an electroless nickel onto the first nickel electroplate layer,
   plating atop the electroless nickel layer with a second nickel electroplate layer, and
   plating atop the second nickel electroplate layer with a noble metal electroplate layer.

7. The process of claim 6, also comprising treating said substrate with an electrolytic nickel strike prior to the plating of said first nickel layer.

8. The process of claim 6, also comprising treating the second nickel electroplate layer with an electrolytic gold strike prior to the plating with said noble metal layer.

9. The process of claim 6, wherein said electroless nickel layer is deposited to a thickness of substantially 20 to 80 microinches.

10. The process of claim 6, wherein said second electroplate nickel layer is plated to a thickness of substantially 50 to 150 microinches.

11. A closure device for hermetically sealing an electronics package, comprising
    a base layer of an iron-based alloy,
    a first nickel layer being one of an electroless nickel deposited layer and an electrolytic nickel plated layer,
    a second nickel layer being the other of said electroless nickel deposited layer and said electrolytic nickel plated layer, and
    an outer layer of a noble metal.

12. The closure device of claim 11 further comprising a third layer on said second layer being of said one of said electroless and said electrolytic nickel layers.

13. A closure device or hermetically sealing an electronics package, comprising
    a base layer of an iron-based alloy,
    a first layer of an electroless nickel;
    a second layer of an electrolytic nickel plated on said first layer;
    a third layer of said electroless nickel deposited on said second layer; and
    an outer layer of a noble metal.

14. The closure device of claim 13 further comprising a fourth layer of said electrolytic nickel plated on said third layer.

15. A closure device for hermetically sealing an electronics package, comprising a base layer of an iron-based alloy, a plurality of alternating layers of electroless nickel and electrolytic nickel, and an outer layer of a noble metal.

* * * * *

UNITED STATES PATENT AND TRADEMARK OFFICE
CERTIFICATE OF CORRECTION

PATENT NO. : 4,842,961

DATED : June 27, 1989

INVENTOR(S) : Thomas J. Basile et al.

It is certified that error appears in the above-identified patent and that said Letters Patent is hereby corrected as shown below:

Col. 6, line 46, "or" should read --for--.

Signed and Sealed this

Eighth Day of May, 1990

Attest:

HARRY F. MANBECK, JR.

Attesting Officer

Commissioner of Patents and Trademarks